(12) United States Patent
Siriani et al.

(10) Patent No.: US 11,462,885 B2
(45) Date of Patent: Oct. 4, 2022

(54) VARIABLE-CONFINEMENT MONOLITHIC MASTER OSCILLATOR POWER AMPLIFIER

(71) Applicant: Cisco Technology, Inc., San Jose, CA (US)

(72) Inventors: Dominic F. Siriani, Allentown, PA (US); Vipulkumar K. Patel, Breinigsville, PA (US)

(73) Assignee: Cisco Technology, Inc., San Jose, CA (US)

( * ) Notice: Subject to any disclaimer, the term of this patent is extended or adjusted under 35 U.S.C. 154(b) by 622 days.

(21) Appl. No.: 16/366,756

(22) Filed: Mar. 27, 2019

(65) Prior Publication Data
US 2020/0313390 A1    Oct. 1, 2020

(51) Int. Cl.
  *H01S 5/10*   (2021.01)
  *H01S 5/026*  (2006.01)
  *H03F 3/20*   (2006.01)

(52) U.S. Cl.
  CPC .......... *H01S 5/1014* (2013.01); *H01S 5/0265* (2013.01); *H01S 5/1064* (2013.01); *H03F 3/20* (2013.01)

(58) Field of Classification Search
  CPC ....... H01S 5/1014; H01S 5/1028; H01S 5/026
  See application file for complete search history.

(56) References Cited

U.S. PATENT DOCUMENTS

| 5,003,550 | A | 3/1991 | Welch et al. |
| 8,994,004 | B2 | 3/2015 | Bowers |
| 9,274,275 | B2 | 3/2016 | Webster et al. |
| 10,320,151 | B1 | 6/2019 | Traverso et al. |
| 2007/0058685 | A1* | 3/2007 | O'Daniel .............. H01S 5/1082 372/32 |
| 2007/0133639 | A1* | 6/2007 | Oh ........................... H01S 5/12 372/50.11 |
| 2007/0189688 | A1 | 8/2007 | Dehlinger et al. |
| 2008/0273567 | A1 | 11/2008 | Yariv et al. |
| 2010/0158429 | A1 | 6/2010 | Popovic |
| 2014/0079082 | A1 | 3/2014 | Feng et al. |
| 2015/0092800 | A1 | 4/2015 | Zucker et al. |
| 2015/0277036 | A1* | 10/2015 | Jiang ....................... G02B 6/12 385/43 |

(Continued)

FOREIGN PATENT DOCUMENTS

EP    2854241 A2    4/2015

OTHER PUBLICATIONS

Xia et al. "Photonic Intergration Using Asymmetric Twin-Waveguide (ATG) Technology: Part I—Concepts and Theory", IEEE Journal of Selected Topics in Quantum Electronics, vol. 11, No. 1, pp. 17-29 (2005). (Year: 2005).*

(Continued)

*Primary Examiner* — Eric L Bolda
(74) *Attorney, Agent, or Firm* — Patterson + Sheridan, LLP

(57) ABSTRACT

A master oscillator power amplifier comprises a semiconductor laser formed on a substrate and configured to output an optical signal, and a semiconductor optical amplifier (SOA) formed on the substrate. The SOA comprises an optical waveguide having an optically active region, wherein the optical waveguide is configured to expand a mode size of the optical signal along at least two dimensions.

18 Claims, 9 Drawing Sheets

(56) References Cited

U.S. PATENT DOCUMENTS

2019/0089132 A1   3/2019   Soda
2020/0280171 A1   9/2020   Siriani et al.

OTHER PUBLICATIONS

Gordeev et al., "Transverse single-mode edge-emitting lasers based on coupled waveguides," Opt. Lett., 40, 2150, 2015.
I. Moerman, P. Van Daele, and P. Demeester, "A review on fabrication technologies for the monolithic integration of tapers with III-V semiconductor devices," IEEE J. Select. Topics Quantum Electron., vol. 3, No. 6, pp. 1308-1320, 1997.
Juodawlkis et al., "High-power, low-noise 1.5-um slab-coupled optical waveguide (SCOW) emitters: physics, devices, and applications," IEEE J. Sel. Top. Quant. Electr., 17, 1698, 2011.
Kobayashi et al., "Silicon photonic hybrid ring-filter external cavity wavelength tunable lasers," JLT, 33, 1241-1246, 2015.
Maximov et al., "High-performance 640-nm-range GaInP-AlGaInP lasers based on the longitudinal photonic bandgap crystal with narrow vertical beam divergence," IEEE J. Quant. Electr., 41, 1341, 2005.
Menon et al., "Photonic Integration Using Asymmetric Twin-Waveguide (ATG) Technology: Part II—Devices," IEEE J. Sel. Top. Quant. Electr., 11, 30, 2005.
Miah et al., "Astigmatism-free high-brightness 1060 nm edge-emitting lasers with narrow circular beam profile," Opt. Exp., 24, 30514, 2016.
Pietrzak et al., "Combination of low-index quantum barrier and super large optical cavity designs for ultranarrow vertical far-fields from high-power broad area lasers," IEEE J. Sel. Top. Quant. Electr., 17, 1715, 2011.
Qiu et al., "Design and fabrication of low beam divergence and high kink-free power lasers," IEEE J. Quant. Electr., 41, 1124, 2005.
U.S. Appl. No. 16/294,634, "Supermode Filtering Waveguide Emitters," as filed Mar. 6, 2019.
Xia et al., "Photonic Integration Using Asymmetric Twin-Waveguide (ATG) Technology: Part I—Concepts and Theory," IEEE J. Sel. Top. Quant. Electr., 11, 17, 2005.
Zhao et al., "High Power Indium Phosphide Photonic Integrated Circuits," Manuscript received Feb. 1, 2019, IEEE, 11 pages.
U.S. Appl. No. 16/581,923 "Variable Confinement Hybrid Oscillator Power Amplifier,", as filed on Sep. 25, 2019.
Nikita Yu. Gordeev, Alexey S. Payusov, Yuri M. Shemyakov, Sergey A. Mintairov, Nikolay A. Kalyuzhnyy, Marina M. Kulagina, and Mikhail V. Maximov, "Transverse single-mode edge-emitting lasers based on coupled waveguides," Optics Letters, vol. 40, Issue 9, pp. 2150-2152 (2015).
U.S. Appl. No. 16/751,994 "Optical Waveguide Emitter With Turning Waveguide Section," as filed on Jan. 24, 2020.
PCT International Search Report for Application No. PCT/US2020/020372 dated May 26, 2020.
Tuorila et al.,"Low loss GaInNAs/GaAs gain waveguides with U-bend geometry for single-facet coupling in hybrid photonic integration," Appl. Phys. Lett. 113, 041104 (2018) [Abstract Only].
PCT Notification of Transmittal of the International Search Report and the Written Opinion of the International Searching Authority, or the Declaration for Application No. PCT/US2020/024716 dated Jul. 10, 2020.
Amnon Yariv et al., "Supermode Si/III-V hybrid lasers, optical amplifiers and modulators: A Proposal and Analysis," Optics Express, vol. 15, No. 15, Jul. 11, 2007, pp. 9147-5273.
Kasper van Gasse et al., "27 dB gain III-V-on-Silicon Semi-Conductor optical amplifier with > 17 dBm Output Power," Optics Express, vol. 27, No. 1, Jan. 4, 2019, p. 293.
O'Brien et al., "Operating characteristics of a high-power monolithically integrated flared amplifier master oscillator power amplifier," IEEE Journal of Quantum Electronics, 29, 2052-2057, 1993.
Wenzel et al., "10 W continuous-wave monolithically integrated master-oscillator power-amplifier," Electronics Letters, 13, 160-161, 2007.
PCT, International Preliminary Report on Patentability for Application PCT/US2020/020372 dated Aug. 25, 2021.

\* cited by examiner

US 11,462,885 B2

VARIABLE-CONFINEMENT MONOLITHIC MASTER OSCILLATOR POWER AMPLIFIER

TECHNICAL FIELD

Embodiments presented in this disclosure generally relate to a variable-confinement monolithic master oscillator power amplifier, and more specifically, to a master oscillator power amplifier including a supermode filtering waveguide emitter.

BACKGROUND

Coherent modulation formats are of primary interest for long-haul and metro applications, and are gaining increased attention for shorter-reach and data center interconnect (DCI) applications. However, coherent modulators in silicon are inherently high-loss due to modulating both phase and amplitude. For upcoming 600 GB, 800 GB, and 1 TB applications, the transmitter insertion loss of the coherent modulators is estimated at 25-29 dB. Meanwhile, the required transmitter output power into the optical fiber is between 0 and +3 dBm.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
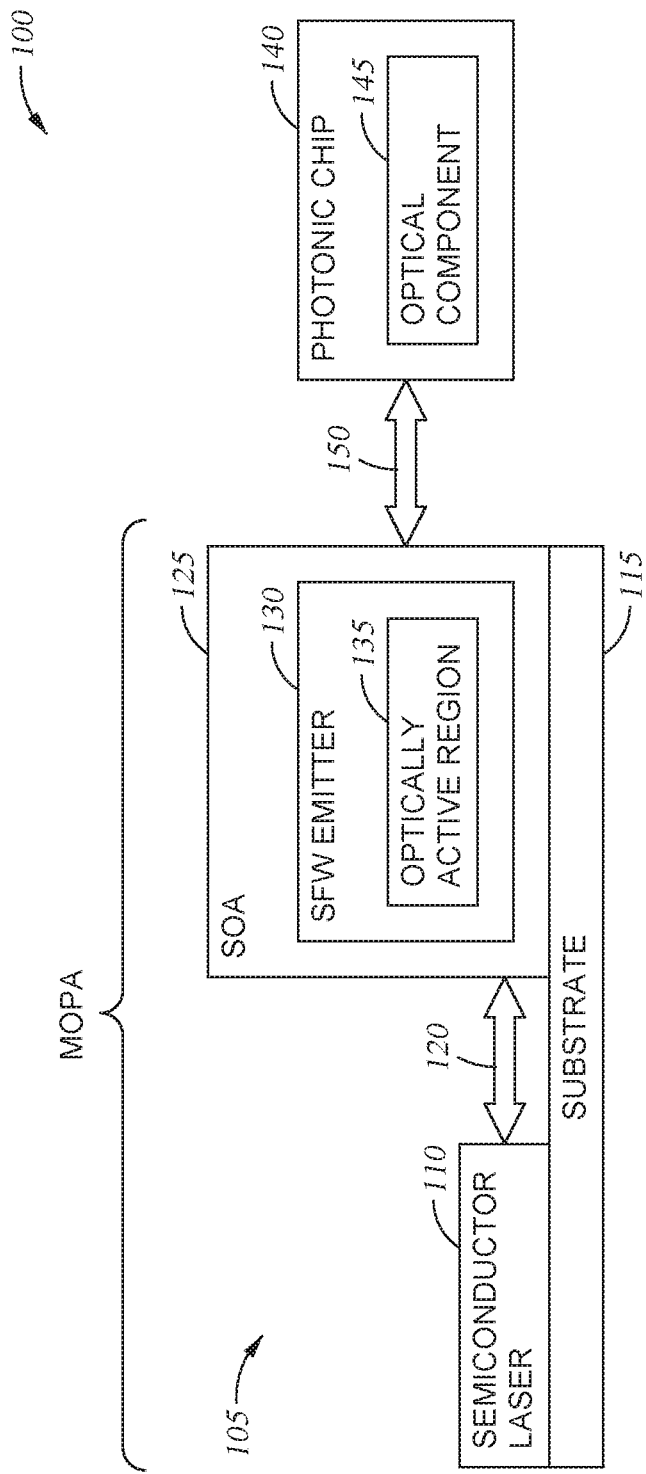
FIG. 1 is a block diagram of an exemplary optical system, according to one or more embodiments.

In one embodiment, an optical apparatus comprises a semiconductor laser formed on a substrate, and a supermode filtering waveguide (SFW) emitter formed on the substrate and optically coupled with the semiconductor laser. The SFW emitter comprises a first optical waveguide evanescently coupled with a second optical waveguide. The first optical waveguide and second optical waveguide are collectively configured to selectively propagate only a first mode of a plurality of optical modes. One of the first optical waveguide and the second optical waveguide comprises an optically active region.

In another embodiment, a master oscillator power amplifier comprises a semiconductor laser formed on a substrate and configured to output an optical signal, and a semiconductor optical amplifier (SOA) formed on the substrate. The SOA comprises an optical waveguide having an optically active region, wherein the optical waveguide is configured to expand a mode size of the optical signal along at least two dimensions.

In another embodiment, an optical system comprises a photonic chip comprising an optical component, a semiconductor laser formed on a substrate separate from the photonic chip, and a supermode filtering waveguide (SFW) emitter formed on the substrate and optically coupled with the semiconductor laser and with the optical component. The SFW emitter comprises a first optical waveguide evanescently coupled with a second optical waveguide. The first optical waveguide and second optical waveguide are collectively configured to selectively propagate only a first mode of a plurality of optical modes. One of the first optical waveguide and the second optical waveguide comprises an optically active region.

Example Embodiments

Laser sources used with photonic chips face many challenges, including scaling to higher output power levels to support higher data rates (i.e., through faster modulation and/or more optical channels), a complicated and/or expensive optical alignment process with the photonic chip, and/or added complexity and optical losses by incorporating a spot size converter. A number of parallel optical channels may be supported using a single, high-power off-chip laser source, which reduces cost, size, and complexity of the laser source.

The maximum output power of a single-frequency laser source is generally a function of waveguide width, thickness, and length. Typical values are about 5 microns or less for the waveguide width, are about 1 micron for the waveguide thickness, and about 1.5 millimeters or less for the waveguide length (e.g., based on technological limits for writing the grating in a distributed feedback laser). The typical values generally limit the maximum output power to less than 100 milliwatts. The output power of the laser source may be increased by following the laser with a semiconductor optical amplifier (SOA). However, the dimensioning of the optical waveguide limits the maximum output power.

According to embodiments discussed herein, a master oscillator power amplifier (MOPA) comprises a semiconductor laser and a SOA. The MOPA provides a high-power, single-frequency laser source on a single chip by integrating a distributed feedback (DFB) laser or distributed Bragg reflector (DBR) laser followed by the SOA. In some embodiments, the monolithic MOPA comprises a coupled supermode filtering waveguide (SFW). The SFW produces a single-mode waveguide with a large optical spot size, and provides flexibility to tailor the optical spot shape through appropriate adjustment of the material stackup. The SFW also allows high optical powers (e.g., 500 milliwatts or greater) to be achieved by producing large-mode, low-confinement structure. In some embodiments, the SFW acts as a spot size converter by varying a ridge width rather than relying on complicated and lossy regrowth processes. Further, the SFW is potentially more reproducibly manufacturable by using a spacer layer as an etch stop layer.

FIG. 1 is a block diagram 100 of an exemplary optical system, according to one or more embodiments. The optical system comprises a master oscillator power amplifier (MOPA) 105 that is optically coupled with a photonic chip 140. The MOPA 105 comprises a semiconductor laser 110 formed on a substrate 115. The semiconductor laser 110 outputs an optical signal 120. In one embodiment, the semiconductor laser 110 is an integrable tunable laser assembly (ITLA) that outputs a continuous wave (CW) optical signal, but other types of optical sources are also contemplated. That is, the semiconductor laser 110 outputs an unmodulated optical signal, which in some cases has an output power that is insufficient for performing coherent modulation. The substrate 115 may be formed of any suitable semiconductor material(s), such as a silicon substrate, an indium phosphide (InP) substrate, and so forth.

The MOPA 105 further comprises a semiconductor optical amplifier (SOA) 125 formed on the substrate 115. The SOA 125 is optically coupled with the semiconductor laser 110, and amplifies the received optical signal 120 using a supermode filtering waveguide (SFW) emitter 130 comprising an optically active region 135. The SOA 125 outputs an amplified optical signal 150 that is received by an optical component 145 of a photonic chip 140. The SOA 125 is dimensioned to provide a desired optical power increase to the optical signal 120. In some embodiments, the SOA 125 (e.g., the SFW emitter 130) is also dimensioned to increase the mode size of the amplified optical signal 150 relative to the mode size of the optical signal 120. With the increased mode size, the SOA 125 may provide an increased coupling efficiency with the optical component 145. For example, the mode size of the amplified optical signal 150 may be selected to substantially match a mode size of the optical component 145.

In some embodiments, the photonic chip 140 comprises a bulk silicon (Si) substrate in which one or more features or materials for the active optical device to be produced (e.g., a laser, detector, modulator, absorber) are pre-processed. In some embodiments, the photonic chip 140 is formed as a silicon on insulator (SOI) device comprising a substrate, a buried insulator layer (or buried oxide (BOX) layer), and a surface layer into which components of the active optical device are formed. The thickness of the surface layer may range from less than 100 nanometers to greater than a micron. More specifically, the surface layer may be between 100-300 nanometers thick. The thickness of the insulation layer may vary depending on the desired application. In one embodiment, the thickness of the insulation layer may range from less than one micron to tens of microns. The thickness of the substrate may vary widely depending on the specific application. For example, the semiconductor substrate may be the thickness of a typical semiconductor wafer (e.g., 100-700 microns) or may be thinned and mounted on another substrate.

Figure 2:
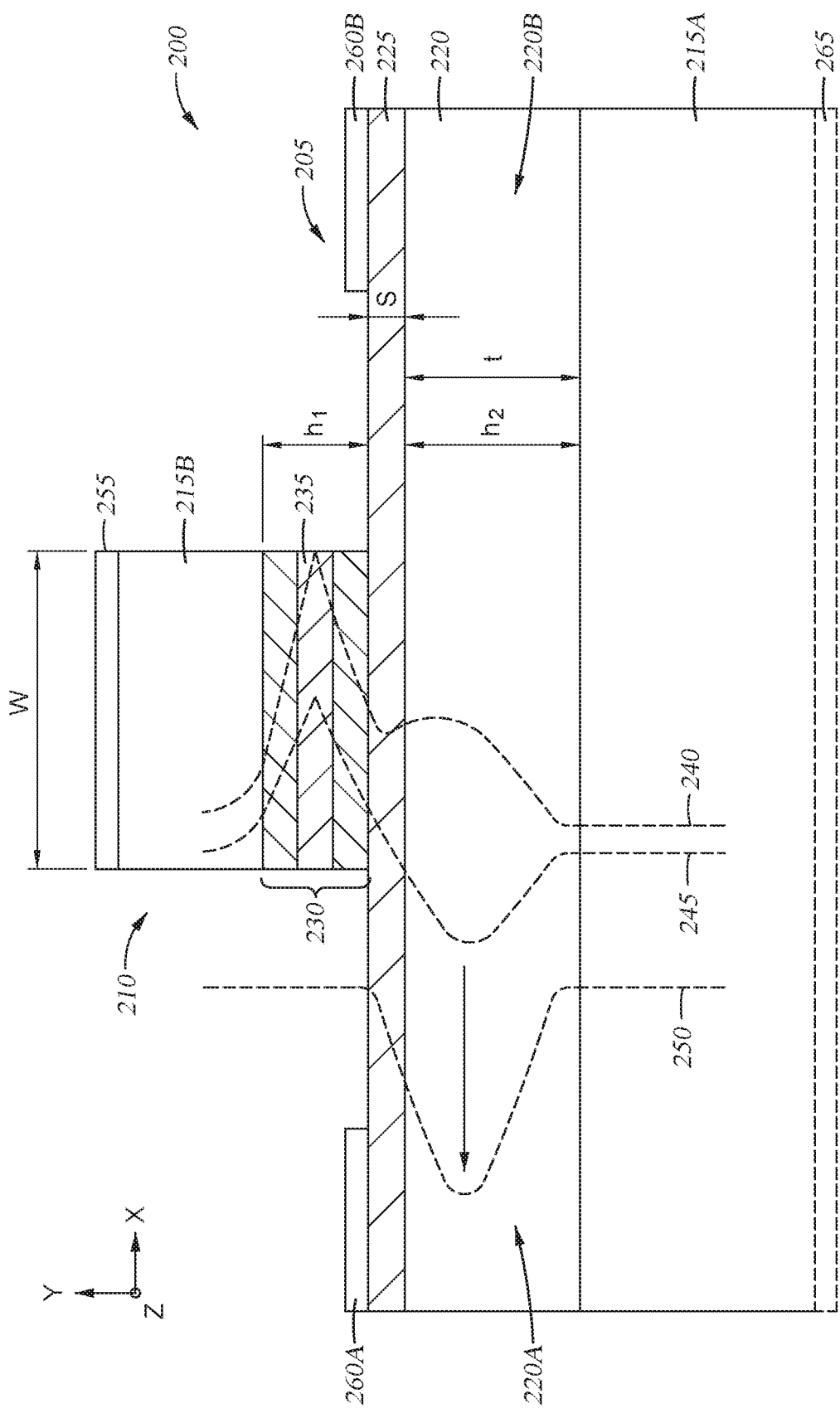
FIG. 2 is a cross-sectional view of a supermode filtering waveguide emitter having an optically active region disposed in a ridge, according to one or more embodiments.

FIG. 2 is a cross-sectional view of a SFW emitter 200 having an optically active region 235 disposed in a ridge portion 210, according to one or more embodiments. The features of the SFW emitter 200 may be used in conjunction with other embodiments, such as being one exemplary implementation of the SFW emitter 130 depicted in FIG. 1.

In the SFW emitter 200, the ridge portion 210 extends from a base portion 205. Generally, the base portion 205 is significantly wider (e.g., along the x-dimension) than the ridge portion 210. The base portion 205 comprises a first optical waveguide 220 arranged above a first cladding layer 215A. The first optical waveguide 220 is configured to extend indefinitely (or for a distance much wider than the ridge portion 210) in the lateral dimension (e.g., along the x-dimension). The first optical waveguide 220 may have any suitable implementation. For example, where the first cladding layer 215A comprises an indium phosphide (InP) semiconductor material, the first optical waveguide 220 may be formed of gallium indium arsenide phosphide (GaInAsP), aluminum gallium indium arsenide (AlGaInAs), or another suitable quaternary compound semiconductor material. In another example, where the first cladding layer 215A comprises an aluminum gallium arsenide (AlGaAs) semiconductor material, the first optical waveguide 220 may be formed of gallium arsenide (GaAs), AlGaAs with a lower proportion of aluminum, and so forth.

The first optical waveguide 220 has a total thickness (t) along the y-dimension. In some embodiments, and as depicted in FIG. 2, the first optical waveguide 220 comprises a single optical waveguide layer arranged above the first cladding layer 215A and having a height ($h_2$) along the y-dimension. In some embodiments, the height ($h_2$) of the single optical waveguide layer equals the total thickness (t) of the first optical waveguide 220, but this is not a requirement. In one alternate embodiment, the first optical waveguide 220 comprises two optical waveguide layers that are spaced apart by a spacer layer, and the total thickness (t) of the first optical waveguide 220 equals a sum of the heights of the two optical waveguide layers and the spacer layer. In another alternate embodiment, the first optical waveguide 220 comprises a dilute waveguide having an alternating arrangement of high effective index layers and low effective index layers, and the total thickness (t) of the first optical waveguide 220 equals a sum of the heights of the high effective index layers and low effective index layers.

The ridge portion 210 comprises a second optical waveguide 230 that is spaced apart from the first optical waveguide 220, and part of a second cladding layer 215B. The second optical waveguide 230 may have any suitable implementation. For example, where the second cladding layer 215B comprises an indium phosphide (InP) semiconductor material, the second optical waveguide 230 may be formed of gallium indium arsenide phosphide (GaInAsP), aluminum gallium indium arsenide (AlGaInAs), or another suitable quaternary compound semiconductor material. In another example, where the second cladding layer 215B comprises an aluminum gallium arsenide (AlGaAs) semiconductor material, the second optical waveguide 230 may be formed of gallium arsenide (GaAs), AlGaAs with a lower proportion of aluminum, and so forth. In some embodiments, the second optical waveguide 230 is implemented with a same material as the first optical waveguide 220, but this is not a requirement.

In some embodiments, and as shown in the SFW emitter 200, an optically active region 235 is disposed in the second optical waveguide 230. In alternate embodiments, the active region 235 is disposed in the first optical waveguide 220. Any suitable optical gain material(s) may be used in the optically active region 235, such as quantum wells, quantum dots, quantum wires, etc., which may be electrically pumped and/or optically pumped.

The first optical waveguide 220 and the second optical waveguide 230 are spaced apart by a spacer layer 225, and form an evanescently coupled waveguide arrangement. As shown, the first optical waveguide 220 and the second optical waveguide 230 are "vertically stacked", although other relative arrangements are also possible. As such, the effective refractive indices of the modes of the independent first optical waveguide 220 and the second optical waveguide 230 should be appropriately chosen to create a desired supermode that is selectively propagated by the SFW emitter 200. The effective refractive indices can be varied by changing a geometry of the first optical waveguide 220 and/or the second optical waveguide 230 (e.g., a width and thickness) or materials (bulk refractive indices). The materials and thickness of the spacer layer 225 also may be chosen to affect the supermode properties. The arrangement of the first optical waveguide 220 and the second optical waveguide 230 can (and generally will) support a plurality of supermodes. However, by virtue of the design of the SFW emitter 200, a fundamental supermode is confined in the ridge portion 210, and all of the other (unwanted) supermodes are filtered out by radiating into the lateral extent of the first optical waveguide 220. Thus, a single mode may be selectively propagated by the SFW emitter 200.

In some embodiments, the second optical waveguide 230 comprises a lower waveguide stratum representing a first region that is doped with a first conductivity type, and an upper waveguide stratum representing a second region that is doped with a different, second conductivity type. As shown, the lower waveguide stratum is adjacent to the spacer layer 225, the upper waveguide stratum is adjacent to the second cladding layer 215B, and the optically active region 235 (e.g., a quantum dot layer) is disposed between the lower waveguide stratum and the upper waveguide stratum. The first optical waveguide 220 may have any suitable doping or may be undoped.

In some embodiments, the second optical waveguide 230 is formed from a III-V semiconductor material or alloy, and has a thickness between about 1 and 2 microns. In some embodiments, a width of the ridge portion 210 ($w$) along the x-dimension is between about 3 and 8 microns. With such dimensioning, a diameter of the optical mode may be about 4 and 5 microns, which is much larger than most semiconductor optical amplifiers (SOAs) that support single mode amplification. As the mode size increases, the optical signal typically has multiple modes. However, the SFW emitter 200 can have a large mode size and still support single mode amplification because of regions 220A, 220B of the first optical waveguide 220 that are disposed away from (e.g., not overlapping with) the ridge portion 210. As an optical signal propagating in the SFW emitter 200 generates additional modes, these modes are transmitted into, and filtered out by, the regions 220A, 220B. In this manner, the SFW emitter 200 supports single mode operation at larger mode sizes supported by other SOAs. In one embodiment, the SFW emitter 200 is a multi-mode amplifier with a vertical mode size of the fundamental mode greater than 2.5 microns $1/e^2$ diameter, which can have significantly higher mode gain than any other higher order modes. In one embodiment, the SFW emitter 200 is a single-mode amplifier with a mode size of the fundamental mode greater than 2.5 microns $1/e^2$ diameter; other modes supported by the waveguide experience a net loss because of the radiation loss to regions 220A, 220B. The relationship $1/e^2$ is a typical metric for describing the size of a Gaussian beam.

The spacer layer 225 is disposed between the first optical waveguide 220 and the second optical waveguide 230. The spacer layer 225 may have any suitable implementation, such as InP or a suitable quaternary compound semiconductor material. In some embodiments, the spacer layer 225 is also doped to be electrically conductive. The spacer layer 225 has a height ($s$) along the y-dimension.

The first optical waveguide 220, the second optical waveguide 230, and/or the spacer layer 225 are dimensioned and arranged such that the first optical waveguide 220 and the second optical waveguide 230 are evanescently coupled. Through the evanescent coupling, the combination of the first optical waveguide 220 and the second optical waveguide 230 are configured to propagate a coupled supermode representing a sum of the modes of the first optical waveguide 220 and the second optical waveguide 230.

Figure 3A:
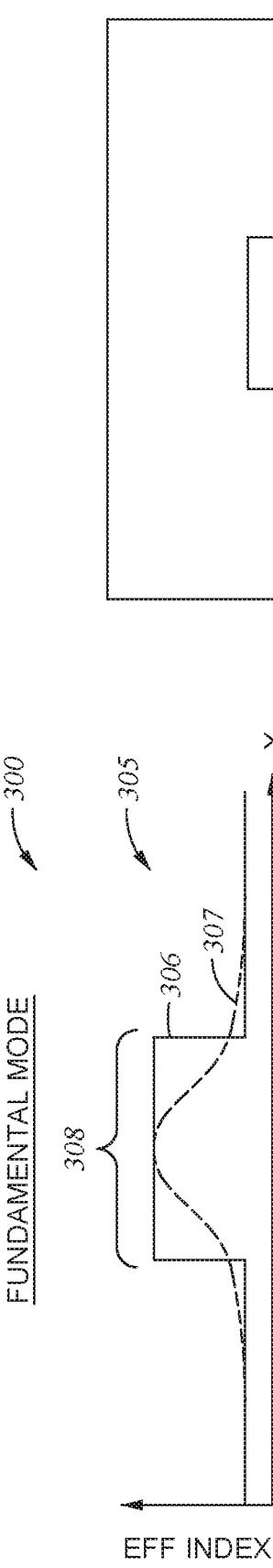
FIGS. 3A and 3B are diagrams illustrating filtering of optical modes using a supermode filtering waveguide emitter, according to one or more embodiments.
Figure 3B:
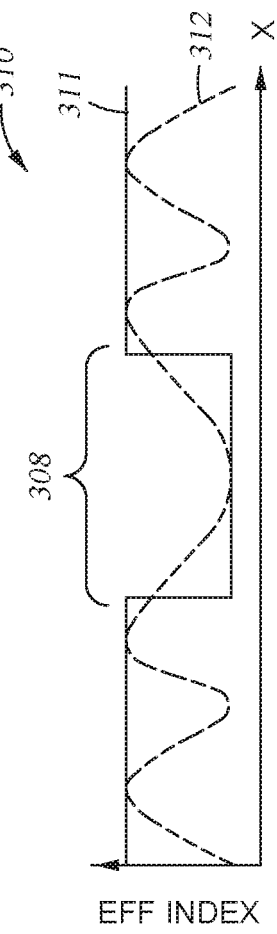

In some embodiments, the second optical waveguide 230 is configured to propagate a plurality of optical modes (illustrated as effective index plots 240, 245, 250), and the first optical waveguide 220 is configured to selectively propagate a first mode of the plurality of optical modes. Described another way, a fundamental coupled mode (illustrated by the effective index plot 240) has an effective index that is greater than that of the first optical waveguide 220, and higher-order coupled modes (illustrated by the effective index plots 245, 250) have effective indexes that are less than that of the first optical waveguide 220. Referring to FIGS. 3A and 3B, a diagram 300 illustrates the effective index presented by the first optical waveguide 220 in graphs 305, 310. In the graph 305, an effective index 306 is greater for a fundamental coupled mode 307 in a region 308 corresponding to the ridge portion 210 of the SFW emitter 200. In the graph 310, an effective index 311 is lesser for higher-order coupled modes 312 in the region 308. Thus, the fundamental coupled mode (e.g., an in-phase optical mode) is confined by the first optical waveguide 220, while the higher-order coupled modes (e.g., out-of-phase optical modes) are radiated away by the first optical waveguide 220.

According to the coupled mode theory for evanescently coupled waveguides, the coupled system of two waveguides supports two supermodes (an in-phase mode and an out-of-phase mode) whose field profiles are approximately described by the superposition of the individual waveguide modes. The effective indices of these modes can be described by the equations $n_{eff}^+ = n + [\Delta n^2 + K^2]^{1/2}$ (in-phase) and $n_{eff}^- = n - [\Delta n^2 + K^2]^{1/2}$ (out-of-phase), where n is the effective indices of the two waveguides averaged, $\Delta n$ is the half the difference of the two waveguides' effective indices, and K is related to the coupling strength between the two waveguides. For the SFW in the region where the upper waveguide is etched away, the mode effective index is approximately equal to the effective index of the lower waveguide(s) alone, which is expressed as $n_{eff}^l = n +/- \Delta n$ (sign depending on how the difference between waveguide effective indices is taken). It is apparent that $n_{eff}^+ > n_{eff}^l > n_{eff}^-$ for $K^2 > 0$. Since in general a mode is pulled into the region with higher refractive index, it follows that the in-phase mode is confined in the ridge portion 210, whereas the out-of-phase mode is pulled into the lateral region (with upper waveguide etched away) where it radiates away from the ridge portion 210 and the optical power is lost. By this principle, the desired in-phase mode is confined to the ridge portion 210, while the unwanted out-of-phase supermode is filtered out by radiating away.

Figure 4:
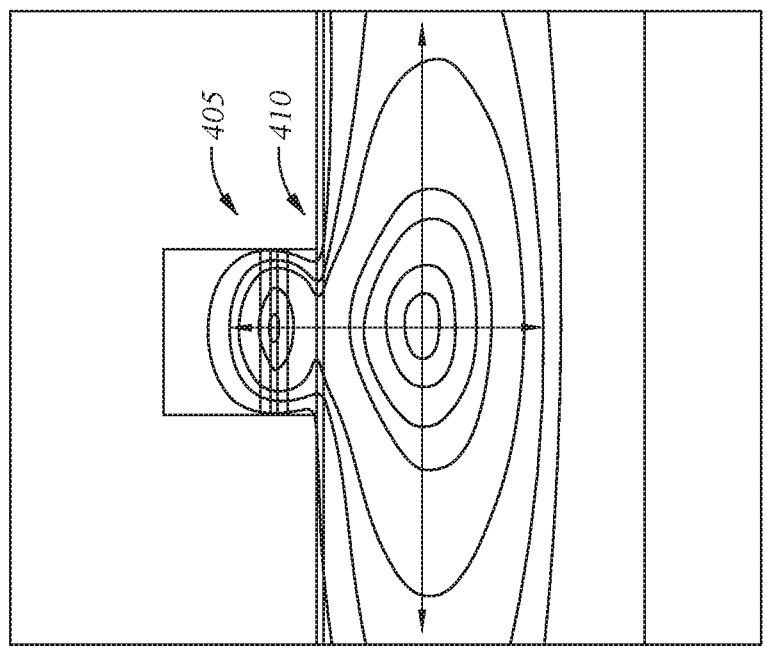
FIG. 4 is a diagram illustrating propagation of an optical mode using a supermode filtering waveguide emitter, according to one or more embodiments.

Referring also to FIG. 4, a diagram 400 illustrates face-view of an optical mode using the SFW emitter 200. In some embodiments, a width (w) of the ridge portion 210 is greater than 4 microns along the x-dimension, and the coupled waveguide geometry of the SFW emitter 200 has a thickness (e.g., $h_1$+s+t) of greater than 4 microns along the y-dimension. Other sizing of the SFW emitter 200 is also contemplated. A first optical mode portion 405 propagates through the second optical waveguide 230, and a second optical mode portion 410 propagates through the first optical waveguide 220. Thus, the SFW emitter 200 supports propagating an optical mode that is greater than 5 microns along the x-dimension, and greater than 4 microns along the y-dimension.

Beneficially, the large size of the optical mode allows for better coupling efficiency and alignment tolerance, which enables passive alignment and bonding of the SFW emitter 200. The large size of the optical mode permits generation of very high optical power levels, e.g., 100 milliwatts to 1 watt or greater, which is approximately an order of magnitude greater than conventional diode lasers. Further, the amplification generated by the SFW emitter 200 can compensate for the higher losses suffered when data rates are increased. For example, the SFW emitter 200 can be used in a transmitter that has an optical signal greater than 50 GHz and supporting data rates between 100 Gbps and 1 Tbps.

The compositions and geometries of the first optical waveguide 220 and/or the second optical waveguide 230 may be selected to control a size and/or shape of the optical mode. As mentioned above, in one alternate embodiment the first optical waveguide 220 comprises two optical waveguide layers that are spaced apart by a spacer layer. In another alternate embodiment, the first optical waveguide 220 comprises a dilute waveguide having an alternating arrangement of high effective index layers and low effective index layers.

The SFW emitter 200 further comprises a first conductive contact layer 255 is arranged above the second cladding layer 215B (e.g., above an upper cladding layer), and a second conductive contact layer is arranged above the spacer layer 225. Within the second conductive contact layer, conductive contacts 260A, 260B are arranged on opposite sides of the ridge portion 210. Beneficially, as the optical field is relatively low in the conductive paths across the spacer layer 225 to the lower waveguide stratum of the second optical waveguide 230, in some cases the first optical waveguide 220 may be undoped, which reduces optical losses in the first optical waveguide 220.

In an alternate embodiment, the second conductive contact layer is arranged as a conductive contact 265 (illustrated in dashes) beneath the first cladding layer 215A (e.g., beneath a lower cladding layer). In such a case, the second cladding layer 215B and the upper waveguide stratum of the second optical waveguide 230 may be doped with a first conductivity type. The first cladding layer 215A, the lower waveguide stratum of the second optical waveguide 230, and/or the first optical waveguide 220 may be doped with a different, second conductivity type. In some embodiments, the spacer layer 225 is also doped to be electrically conductive (e.g., doped with the second conductivity type).

Further, in some embodiments, the spacer layer 225 may operate as an etch stop layer, which can simplify the fabrication process and reduce costs of producing the SFW emitter 200.

Figure 5:
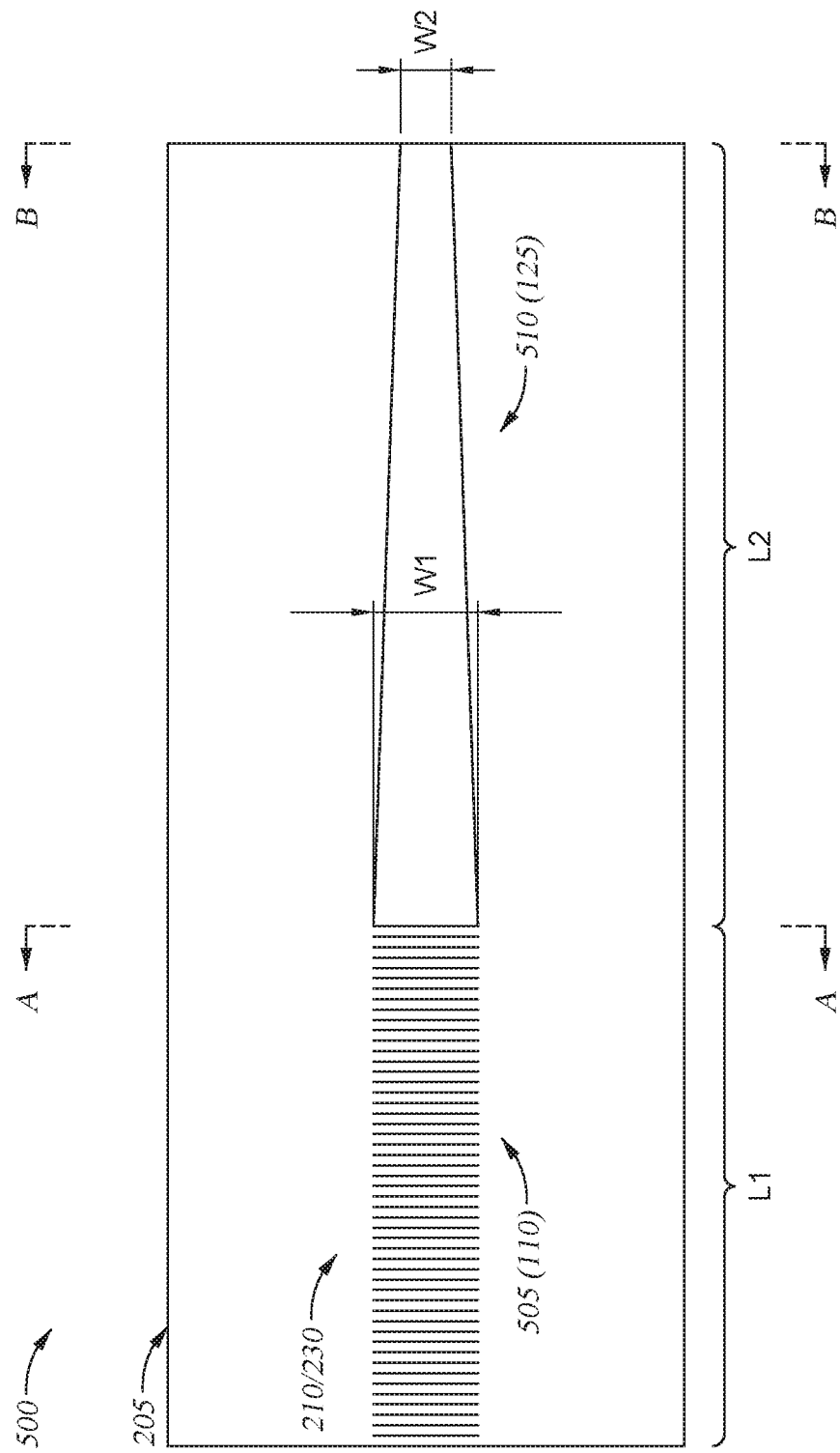
FIG. 5 is a top view of an exemplary master oscillator power amplifier having a supermode filtering waveguide emitter, according to one or more embodiments.

FIG. 5 is a top view 500 of an exemplary MOPA having a SFW emitter, according to one or more embodiments. The features depicted in view 500 may be used in conjunction with other embodiments, e.g., one exemplary implementation of the MOPA 105 of FIG. 1 that incorporates features of the SFW emitter 200 of FIG. 2.

As shown, the ridge portion 210 comprises a laser region 505 (e.g., one example of the semiconductor laser 110 of FIG. 1) and a SOA region 510 (e.g., one example of the SOA 125 of FIG. 1) that are formed in the second optical waveguide 230. The laser region 505 extends to a first facet of the MOPA and the SOA region 510 extends to a second facet of the MOPA. A long axis of the laser region 505 is aligned with a long axis of the SOA region 510. In some embodiments, a first length L1 of the laser region is between 1 and 2 millimeters (mm), and a second length L2 of the SOA region 510 is between 1 and 10 mm. The laser region 505 has a first width W1, and the SOA region 510 tapers from the first width W1 to a second width W2 at the second facet of the MOPA. The laser region 505 and/or the SOA region 510 may have different dimensioning based on a desired optical power and mode sizing. Further, the laser region 505 and the SOA region 510 may have a different relative arrangement (e.g., not aligned along their respective long axes).

A single-frequency laser is formed using the laser region 505. In some embodiments, the laser region 505 comprises a distributed feedback (DFB) laser or a distributed Bragg reflector (DBR) laser, which generally include mirrors defined by a grating pattern along a length of the laser region 505. In this way, the laser region 505 provides an optical signal with a high optical gain to the SOA region 510.

The SOA region 510 increases the optical power of the optical signal provided by the laser region 505. In some embodiments, and as shown, the SOA region 510 is tapered to support higher optical power levels. Beneficially, using features of the SFW emitter, the SOA region 510 is also capable of increasing a vertical spot size of the optical signal, which supports scaling to high optical power levels and providing a large spot size at the output facet to improve coupling efficiency. By also increasing the vertical spot size, the SOA region 510 need not include a very wide optical waveguide to support high optical power levels. A very wide optical waveguide may suffer from low coupling efficiency and other conditions such as bias-dependent astigmatism, which are beneficially avoided by using features of the SFW emitter.

Figure 6A:
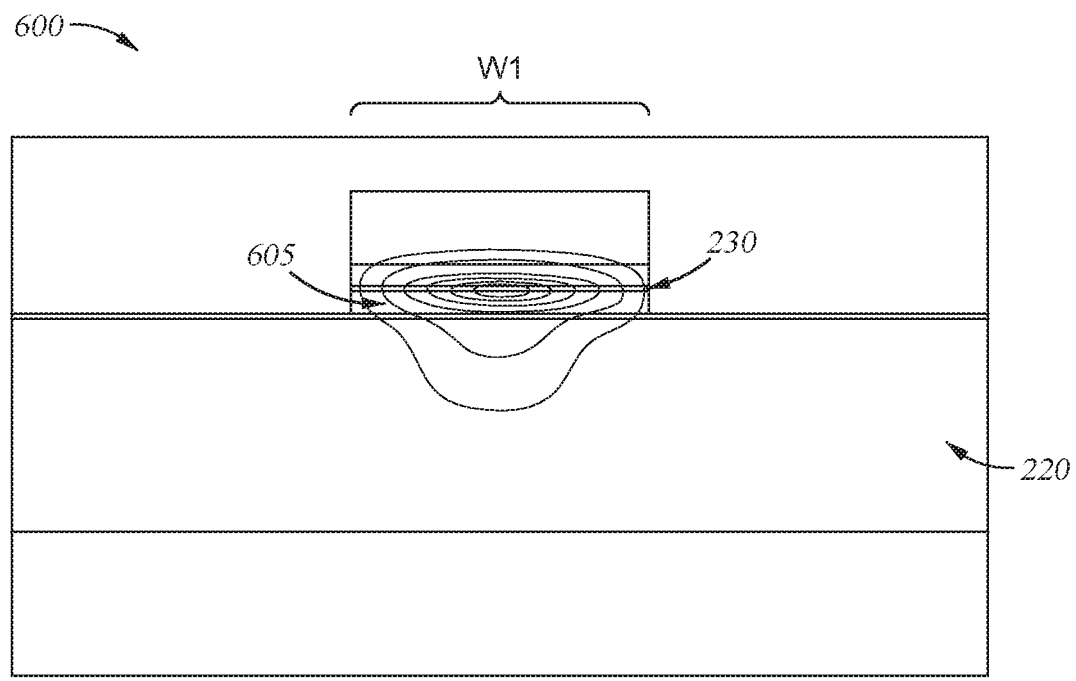
FIGS. 6A and 6B are views of the exemplary master oscillator power amplifier of FIG. 5, according to one or more embodiments.
Figure 6B:
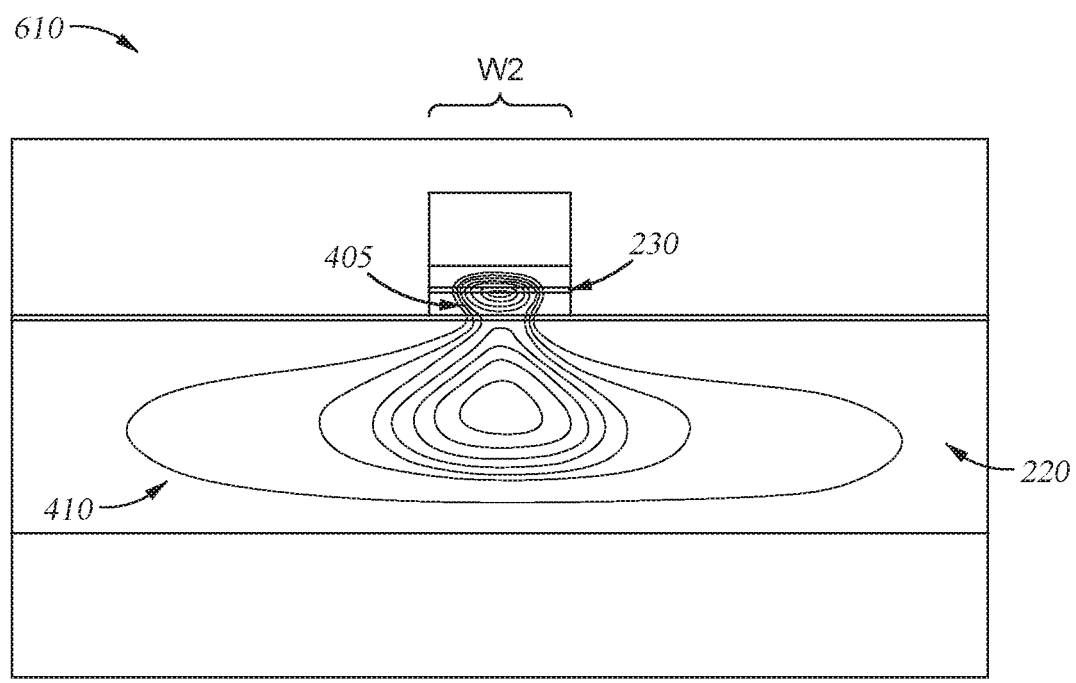

Referring also to FIGS. 6A and 6B, a cross-sectional view 600 of section A-A illustrates an optical mode of the optical signal provided by the laser region 505 at the transition to the SOA region 510, where the SOA region 510 has the first width W1. A face view 610 (i.e., along section B-B) illustrates the optical mode at the facet, where the SOA region 510 has the second (tapered) width W2.

In the cross-sectional view 600, the optical mode 605 is confined mostly within the second optical waveguide 230. The tapering of the second optical waveguide 230 along the SOA region 510 alters the confinement and effectively "pushes" the optical mode partly into the first optical waveguide 220. As shown in the face view 610, the first optical mode portion 405 propagates through the second optical waveguide 230, and the second optical mode portion 410 propagates through the first optical waveguide 220. As discussed above, the larger optical mode allows for better coupling efficiency and alignment tolerance, as well as very high optical power levels.

While the SOA region 510 is shown as tapering from the first width W1 to the second width W2, other techniques may be used in addition to, or alternate to, the tapering to convert the mode sizing of the optical signal. In some embodiments, a sub-wavelength grating is included along a length of the SOA region 510 that uses an effective refractive index effect. The effective refractive index can be controlled based on the fill factor of the sub-wavelength grating.

Figure 7A:
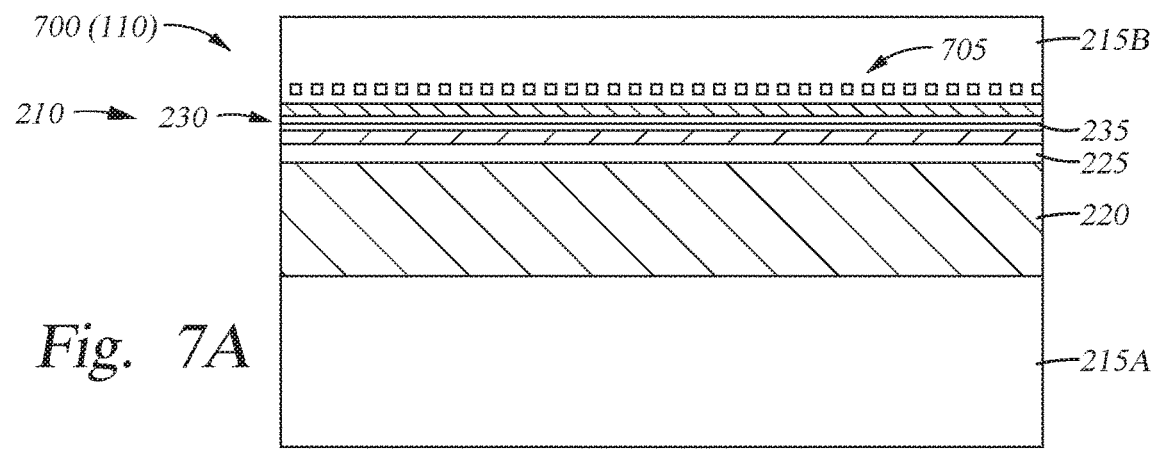
FIGS. 7A-7C illustrate exemplary grating patterns for a semiconductor laser, according to one or more embodiments.
Figure 7B:
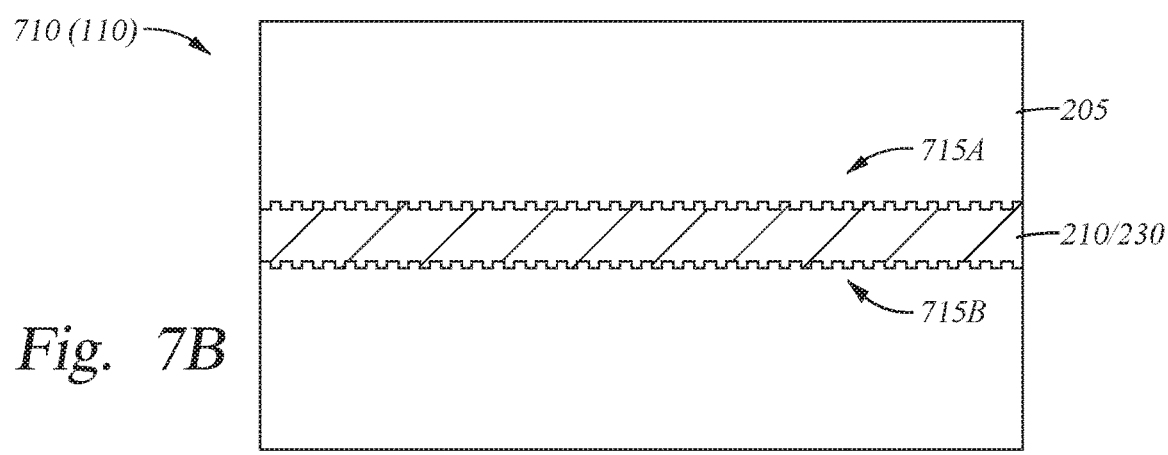
Figure 7C:
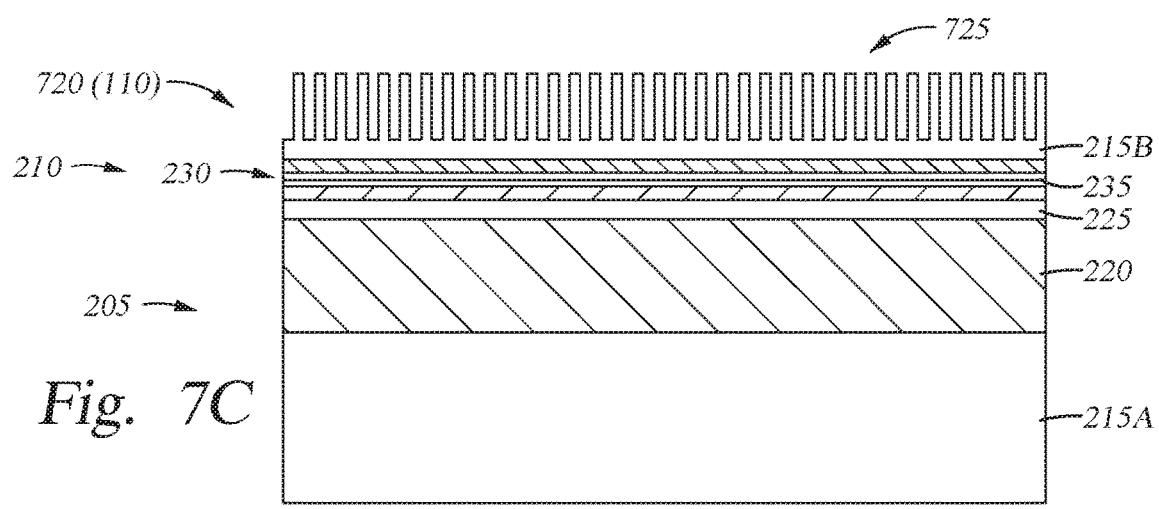

FIGS. 7A-7C illustrate exemplary grating patterns for a semiconductor laser, according to one or more embodiments. The features included in diagrams 700, 710, 720 may be used in conjunction with other embodiments, such as being included in the semiconductor laser 110 of the MOPA 105 depicted in FIG. 1. The grating patterns in the diagrams 700, 710, 720 may be used to form a semiconductor laser of any suitable type, such as a distributed feedback (DFB) laser, a distributed Bragg reflector (DBR) laser, and so forth.

The diagram 700 is a side view of a laser region, in which a grating pattern is formed in a buried grating layer 705. As shown, the buried grating layer 705 is arranged within the second cladding layer 215B, above the upper waveguide stratum of the second optical waveguide 230. The buried grating layer 705 may be formed of any suitable material(s) and the grating pattern dimensioned such that the grating pattern provides a desired optical feedback. For example, where the second cladding layer 215B comprises an indium phosphide (InP) semiconductor material, the buried grating layer 705 may be formed of gallium indium arsenide phosphide (GaInAsP), aluminum gallium indium arsenide (AlGaInAs), or another suitable quaternary compound semiconductor material.

The buried grating layer 705 may have any alternate arrangement within the laser region. For example, the buried grating layer 705 may be arranged within the upper waveguide stratum of the second optical waveguide 230 (e.g., above the optically active region 235), within the lower waveguide stratum of the second optical waveguide 230 (e.g., beneath the optically active region 235), within the spacer layer 225, within the first optical waveguide 220, or within the first cladding layer 215A. In this way, the buried grating layer 705 may be arranged in the ridge portion 210 or the base portion 205.

The diagram 710 is a top view of a laser region, in which the grating pattern is formed along the lateral sides of the ridge portion 210. Stated another way, the sides of the ridge portion 210 are formed as corrugated sides 715A, 715B that create a periodic grating pattern along the length of the ridge portion 210. The corrugated sides 715A, 715B are dimensioned such that the grating pattern provides a desired optical feedback. The corrugated sides 715A, 715B may be alternately formed along other sides of the second optical waveguide 230 formed in the ridge portion 210, such as a top side and/or a bottom side of the second optical waveguide 230.

The diagram 720 is a side view of a laser region, in which a grating pattern 725 is formed into the second cladding layer 215B. Stated another way, the grating pattern 725 may be formed, e.g., by deep etching into a top surface of the ridge portion 210 to create a periodic grating pattern along the length of the ridge portion 210.

Figure 8A:
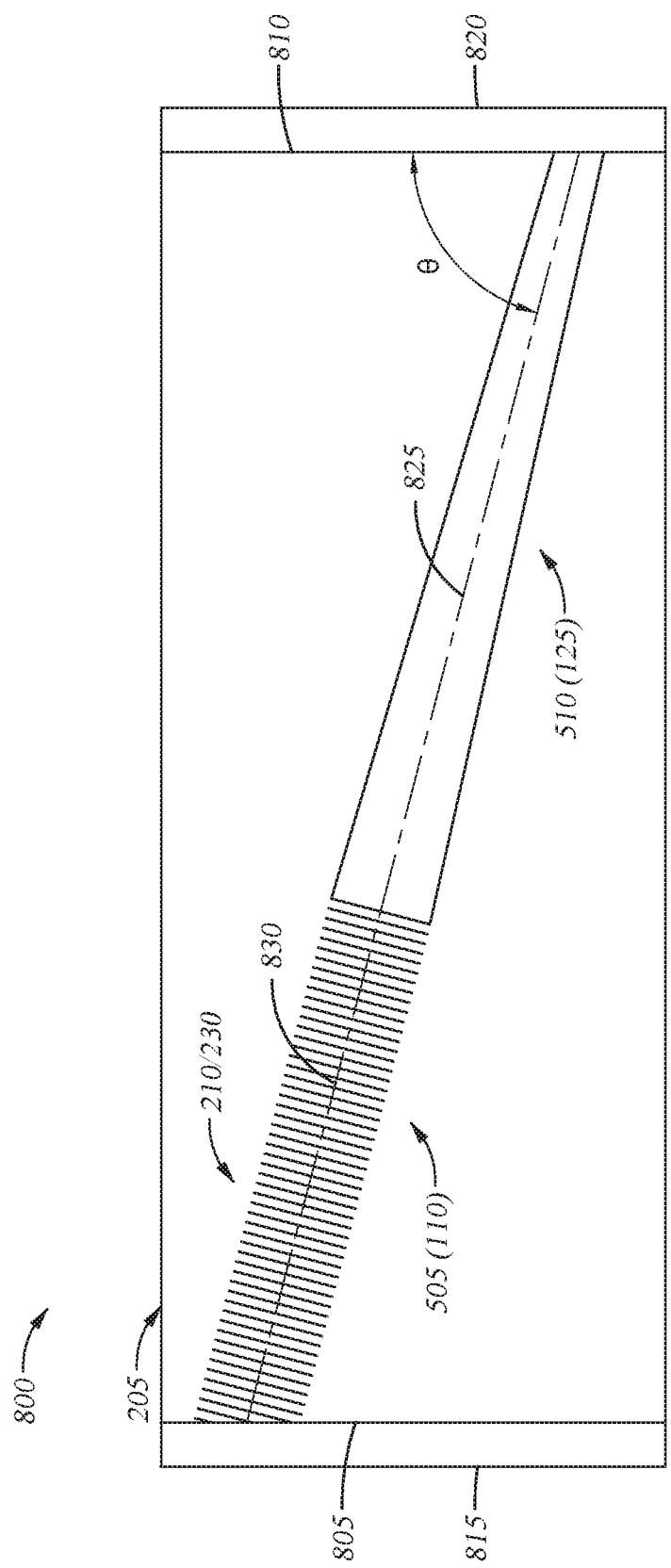
FIGS. 8A and 8B illustrate exemplary arrangements of a semiconductor laser and a semiconductor optical amplifier, according to one or more embodiments.
Figure 8B:
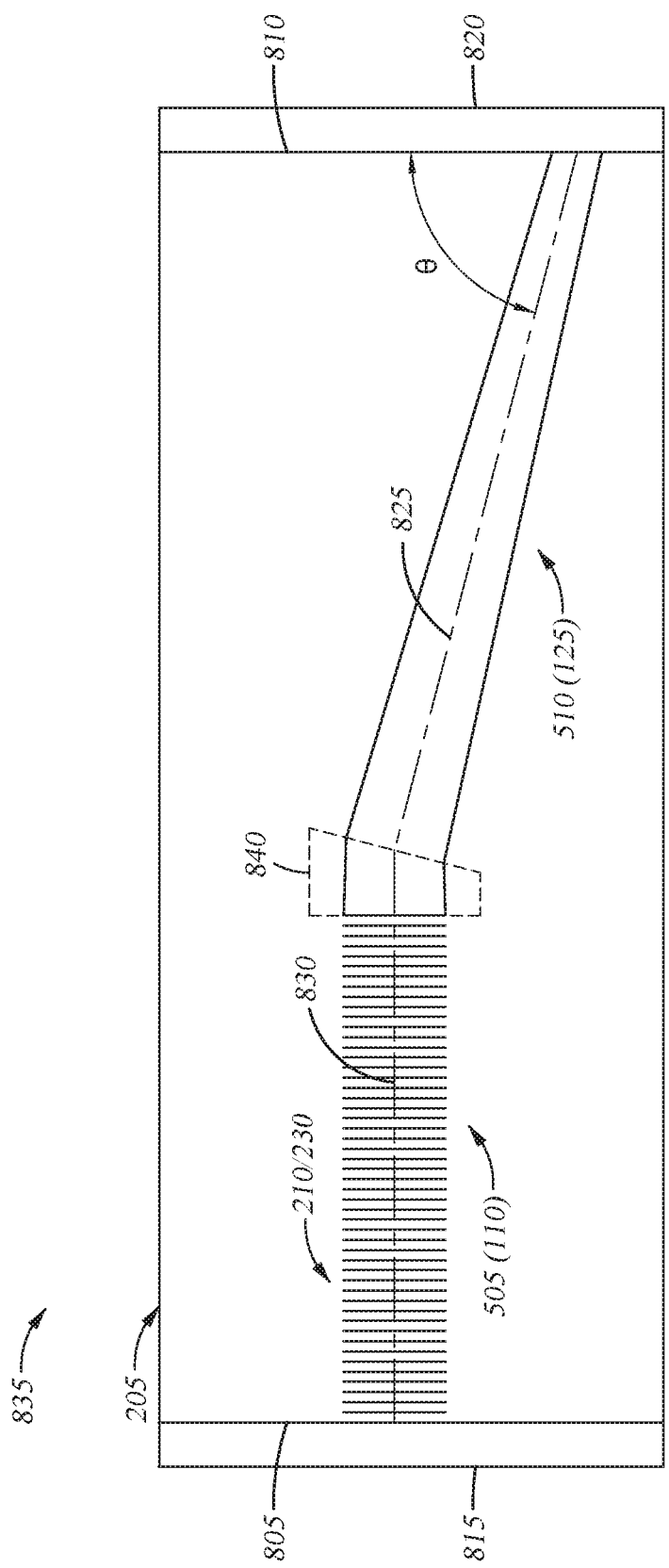

FIGS. 8A and 8B are diagrams 800, 835 illustrating exemplary arrangements of a semiconductor laser and a semiconductor optical amplifier, according to one or more embodiments. The features illustrated in the diagrams 800, 835 may be used in conjunction with other embodiments, such as being included in the MOPA 105 depicted in FIG. 1.

In the diagram 800, the second optical waveguide 230 extends between a first facet 805 and an opposing second facet 810. The semiconductor laser is formed in a laser region 505 of the second optical waveguide 230, which extends to the first facet 805. The SOA is formed in an SOA region 510 of the second optical waveguide 230, which extends to the second facet 810. A long axis 830 of the semiconductor laser is aligned with a long axis 825 of the SOA. The long axis 825 of the SOA (e.g., the long axis of the second optical waveguide 230) intersects with the second facet 810 at a non-orthogonal angle Θ. Beneficially, the intersection of the long axis 825 with the second facet 810 at the non-orthogonal angle Θ mitigates on-chip optical reflections, which reduces the risk of disrupting the semiconductor laser.

In some embodiments, a first coating 815 is applied to the first facet 805 and/or a second coating 820 is applied to the second facet 810. For example, the first coating 815 and/or the second coating 820 may be an anti-reflective coating to mitigate back reflections. Some non-limiting examples of an anti-reflective coating include one or more deposited layers of aluminum oxide ($Al_2O_3$), titanium dioxide ($TiO_2$), silicon dioxide ($SiO_2$), silicon nitride (SiN), magnesium fluoride ($MgF_2$), tantalum pentoxide ($Ta_2O_5$), etc. Beneficially, use of the anti-reflective coatings further mitigates on-chip optical reflections.

In some embodiments, the first coating 815 and/or the second coating 820 may be selected to support the formation of the optical signal by the laser region 505. For example, the first coating 815 may be a high-reflective coating that acts as a mirror for a DFB laser or DBR laser. In another example, the first coating 815 may be an anti-reflective coating for a DFB laser, which reduces the risk of problems with the grating phase. In the DFB laser, the optical power lost due to the anti-reflective coating is relatively small compared to the optical power provided by the SOA.

In some embodiments, and as shown in the diagram 835, a transition region 840 (e.g., a bend region) is arranged between the semiconductor laser and the SOA. The transition region 840 allows the long axis 830 of the semiconductor laser to be unaligned with the long axis 825 of the SOA. For example, the long axis 830 may be orthogonal to the first facet 805, and the long axis 825 intersects with the second facet 810 at the non-orthogonal angle θ. Beneficially, use of the transition region 840 further mitigates on-chip optical reflections. Further, in some embodiments, the effective refractive index effect may be controlled in the transition region to further mitigate on-chip optical reflections.

Figure 9:
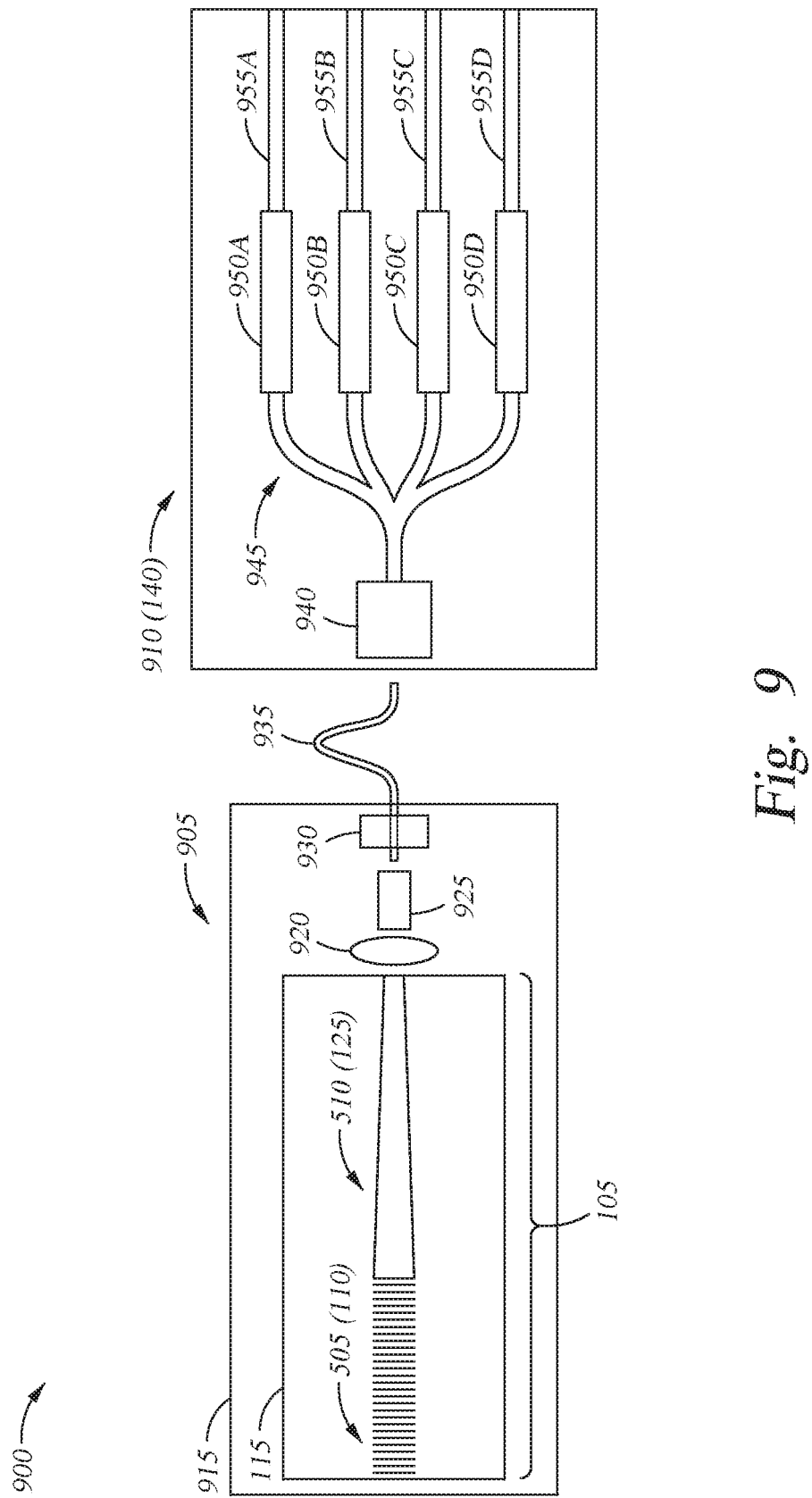
FIG. 9 is a top view of an exemplary optical system, according to one or more embodiments.

FIG. 9 is a top view of an exemplary optical system 900, according to one or more embodiments. More specifically, the MOPA 105 of the optical system 900 provides a high optical output power that is suitable for use as a remote laser source 905 for supporting a plurality of optical channels and/or a plurality of photonic modules. The features illustrated in the optical system 900 may be used in conjunction with other embodiments.

The optical system 900 comprises a photonic chip 910 comprising an edge coupler 940 that is optically exposed at a side surface of the photonic chip 910. As used herein, "optically exposed" means the edge coupler 940 is physically exposed at the side surface, or is slightly recessed from the side surface (e.g., 1-5 microns) but can nonetheless optically couple to an external light-carrying medium (e.g., an optical fiber 935). In some embodiments, the edge coupler 940 is formed using a multi-prong, embedded structure and is configured to transition the optical mode between the optical fiber 935 and an optical splitter 945 optically coupled with the edge coupler 940. The photonic chip 910 further comprises a plurality of optical modulators 950A, 950B, 950C, 950D, and a plurality of optical waveguides 955A, 955B, 955C, 955D.

The optical system 900 further comprises the remote laser source 905 optically coupled with the edge coupler 940 of the photonic chip 910. The remote laser source 905 comprises a substrate 915, the MOPA 105 disposed on the substrate 915, a lens 920 disposed on the substrate 915, an optical isolator 925 disposed on the substrate 915, and an attachment region 930 disposed on the substrate 915. An optical fiber 935 is rigidly attached to the substrate 915 at the attachment region 930. In one example, the attachment region 930 is a trench formed into the substrate 915, and an epoxy deposited in the trench is cured after the optical fiber 935 is aligned with the optical isolator 925. The optical fiber 935 may also be rigidly attached to the photonic chip 910. For example, an index-matching epoxy disposed between the optical fiber 935 and the side surface of the photonic chip 910 is cured after the optical fiber 935 is aligned with the edge coupler 940. Other techniques for fixedly arranging the optical fiber 935 relative to the optical components of the remote laser source 905 (e.g., the optical isolator 925) and/or the photonic chip 910 (e.g., the edge coupler 940) are also contemplated. For example, the optical fiber 935 may be attached to a fiber array unit that contacts the substrate 915.

The optical signal generated by the MOPA 105 (e.g., a CW optical signal) propagates through the lens 920 and the optical isolator 925, and through the optical fiber 935 into the edge coupler 940. The optical splitter 945 distributes optical power from the optical signal onto four (4) optical channels, each having a respective optical modulator 950A, 950B, 950C, 950D and a respective optical waveguide 955A, 955B, 955C, 955D. Other numbers of optical channels are also contemplated, which in some cases is limited only by the optical output power of the MOPA 105. Further, the optical channels may have any alternate configuration(s). In alternate embodiments, the remote laser source 905 may be used for in-package optics (IPO). In alternate embodiments, the distribution of the optical power performed by the optical splitter 945 may be implemented in the optical fiber 935.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

Aspects of the present disclosure are described with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality and operation of possible implementations of systems, methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. An optical apparatus comprising:
   a semiconductor laser formed on a substrate; and
   a supermode filtering waveguide (SFW) emitter formed on the substrate and optically coupled with the semiconductor laser, the SFW emitter comprising a first optical waveguide evanescently coupled with a second optical waveguide, wherein the first optical waveguide is disposed in a base portion of the SFW emitter, wherein the second optical waveguide is disposed in a ridge portion of the SFW emitter across a length of the ridge portion, wherein the ridge portion extends from the base portion, wherein a grating pattern of the semiconductor laser is formed into the ridge portion such that the second optical waveguide is between the first optical waveguide and the grating pattern, such that the grating pattern starts at a first facet of the optical apparatus and ends at a point along the length of the ridge portion, and such that a width of the second waveguide tapers between the point along the length of the ridge portion and a second facet of the optical apparatus, wherein the first optical waveguide and second optical waveguide are collectively configured to selectively propagate only a first mode of a plurality of optical modes, wherein one of the first optical waveguide and the second optical waveguide comprises an optically active region.

2. The optical apparatus of claim 1, wherein the first optical waveguide and the second optical waveguide are spaced apart by a spacer layer.

3. The optical apparatus of claim 1,
wherein the second optical waveguide has different widths along the ridge portion, and
wherein the different widths alter a confinement of the first mode as an optical signal propagates through the second optical waveguide.

4. The optical apparatus of claim 1, further comprising a sub-wavelength grating in one of: (i) the SFW emitter and (ii) a transition region between the semiconductor laser and the SFW emitter.

5. The optical apparatus of claim 1, wherein the semiconductor laser comprises a buried grating layer.

6. The optical apparatus of claim 1,
wherein a long axis of the second optical waveguide intersects with the second facet at a non-orthogonal angle.

7. The optical apparatus of claim 6, wherein a long axis of the semiconductor laser is aligned with the long axis of the second optical waveguide.

8. The optical apparatus of claim 6, wherein a long axis of the semiconductor laser is unaligned with the long axis of the second optical waveguide.

9. The optical apparatus of claim 6, wherein an anti-reflective coating is applied to the second facet.

10. The optical apparatus of claim 6, wherein one of an anti-reflective coating and a high reflectivity coating is applied to the first facet.

11. The optical apparatus of claim 1, wherein the optically active region comprises one or more of quantum wells, quantum dots, and quantum wires.

12. A master oscillator power amplifier comprising:
a semiconductor laser formed on a substrate and configured to output an optical signal; and
a semiconductor optical amplifier (SOA) formed on the substrate, the SOA comprising a first optical waveguide and a second optical waveguide having an optically active region, wherein the first optical waveguide is disposed in a base portion of the SOA, wherein the second optical waveguide is disposed in a ridge portion of the SOA across a length of the ridge portion, wherein the ridge portion extends from the base portion, wherein a grating pattern of the semiconductor laser is formed into the ridge portion such that the second optical waveguide is between the first optical waveguide and the grating pattern, such that the grating pattern starts at a first facet of the SOA and ends at a point along the length of the ridge portion, and such that a width of the second waveguide tapers between the point along the length of the ridge portion and a second facet of the SOA, and wherein the first optical waveguide is configured to expand a mode size of the optical signal along at least two dimensions.

13. The master oscillator power amplifier of claim 12, wherein:
the first optical waveguide is spaced apart from the second optical waveguide by a spacer layer,
wherein the first optical waveguide receives the optical signal and is dimensioned to expand the mode size into the second optical waveguide.

14. The master oscillator power amplifier of claim 13, wherein the first optical waveguide and second optical waveguide are collectively configured to selectively propagate only a first mode of a plurality of optical modes.

15. The master oscillator power amplifier of claim 13, wherein the optically active region comprises one or more of quantum wells, quantum dots, and quantum wires.

16. An optical system comprising:
a photonic chip comprising an optical component;
a semiconductor laser formed on a substrate separate from the photonic chip; and
a supermode filtering waveguide (SFW) emitter formed on the substrate and optically coupled with the semiconductor laser and with the optical component, the SFW emitter comprising a first optical waveguide evanescently coupled with a second optical waveguide, wherein the first optical waveguide is disposed in a base portion of the SFW emitter, wherein the second optical waveguide is disposed in a ridge portion of the SFW emitter across a length of the ridge portion, wherein the ridge portion extends from the base portion, and wherein a grating pattern of the semiconductor laser is formed into the ridge portion such that the second optical waveguide is between the first optical waveguide and the grating pattern, such that the grating pattern starts at a first facet of the ridge portion and ends at a point along the length of the ridge portion, and such that a width of the second waveguide tapers between the point along the length of the ridge portion and a second facet of the ridge portion,
wherein the first optical waveguide and second optical waveguide are collectively configured to selectively propagate only a first mode of a plurality of optical modes,
wherein one of the first optical waveguide and the second optical waveguide comprises an optically active region.

17. The optical system of claim 16, wherein the optical component comprises an edge coupler.

18. The optical system of claim 17,
wherein the SFW emitter is configured to expand, along at least two dimensions, a mode size of an optical signal received from the semiconductor laser, and
wherein the mode size of the optical signal substantially matches a mode size of the edge coupler.

* * * * *